US009005364B2

(12) United States Patent
Gentile et al.

(10) Patent No.: US 9,005,364 B2
(45) Date of Patent: Apr. 14, 2015

(54) PALETTE MODULAR DEVICE FOR COLLECTION AND RECOVERY OF METALS IN THIN FILM DEPOSITION EQUIPMENT

(75) Inventors: Antonio Andrea Gentile, Carmiano (IT); Salvatore Modeo, Avetrana (IT)

(73) Assignee: MRS S.n.c. di Gentile Antonio Andrea & Modeo Salvatore, Carmiano (LE) (IT)

( * ) Notice: Subject to any disclaimer, the term of this patent is extended or adjusted under 35 U.S.C. 154(b) by 196 days.

(21) Appl. No.: 13/635,038

(22) PCT Filed: Mar. 18, 2011

(86) PCT No.: PCT/IB2011/000578
§ 371 (c)(1),
(2), (4) Date: Sep. 14, 2012

(87) PCT Pub. No.: WO2011/114223
PCT Pub. Date: Sep. 22, 2011

(65) Prior Publication Data
US 2013/0008375 A1 Jan. 10, 2013

(30) Foreign Application Priority Data

Mar. 19, 2010 (IT) .............................. LE2010A0001

(51) Int. Cl.
*B05C 11/10* (2006.01)
*B05C 11/00* (2006.01)
*C23C 14/56* (2006.01)
*C23C 16/44* (2006.01)

(52) U.S. Cl.
CPC ............ *C23C 14/564* (2013.01); *B05C 11/1036* (2013.01); *C23C 16/4401* (2013.01)

(58) Field of Classification Search
CPC ........................... C23C 16/4401; C23C 14/564
See application file for complete search history.

(56) References Cited

U.S. PATENT DOCUMENTS 4,976,217 A * 12/1990 Frijlink ........................ 118/733
5,765,307 A * 6/1998 Grimes ........................ 49/77.1

* cited by examiner

*Primary Examiner* — Dah-Wei D Yuan
*Assistant Examiner* — Stephen Kitt
(74) *Attorney, Agent, or Firm* — R.Ruschena Patent Agent, LLC

(57) ABSTRACT

An electro-mechanical system for the collection and recovery of materials inside thin-film deposition facilities, comprising multiple elements able to intercept the wasted particles of material during a coating process. These elements are disposed in individual modules (1, 5), possibly combined in multiple configurations according to the shape of the deposition chamber; swivel, depending on the material to be recovered, thanks to a power unit (4), a transmission system (6, 10, 15a, 15b), an electronic interface (9) to automate the rotation of the elements. These elements can be palettes (3) placed vertically in each of the modules (1, 5), made of a composite material, characterized by a core of metallic material or alumina and by two surface polymeric layers with low adhesion to the selected core and therefore easily removable, but at the same time resistant to the temperature and pressure conditions inside the deposition chamber.

10 Claims, 3 Drawing Sheets

PALETTE MODULAR DEVICE FOR COLLECTION AND RECOVERY OF METALS IN THIN FILM DEPOSITION EQUIPMENT

RELATED APPLICATIONS

This application is the U.S. National Stage under 35 USC 371 of PCT Application PCT/IB2011/000578.

BACKGROUND OF THE INVENTION

1. Field of the Invention

The subject of this invention is a system, composed by palettes, for the collection and recovery of metals in thin film deposition processes, in particular those making use of vacuum chambers.

2. Brief Description of the Prior Art

According to the known art, no systems are currently able to recover the materials used in metallic thin-films coating processes inside vacuum chambers, regardless of the coating technology used.

Among the 'physical coating' technologies for a thin-film of a certain material from now on: the target material) on a substrate surface (from now on: the sample's surface), we will essentially refer to:
1) thermal evaporation;
2) electron beam evaporation;
3) sputtering;
4) arc vapour deposition;
5) ion-plating.

The basic principle is that the particles of the target material to be deposited are able to atomistic escape from the surface of the bulk material, and are diffused through the chamber to reach the target surface. Once there, they condense forming the desired film.

Thermal and electronic beam (e-beam) evaporation rely on the vaporization of the material, obtained by heating it at high temperatures. The only difference among them is the system used to heat the bulk 'source' in the 'melting pot': the Joule effect in the first case and a high-energy electron beam in the second one.

In these techniques, the presence of a high vacuum chamber ($10^{-5}$-$10^{-9}$ torr) is crucial in order to obtain a good quality for the deposited film.

Moreover, there are three factors that require these chambers to be usually much bigger (say the height of the chamber is 'h', and its width l') than the dimensions of the sample used in the deposition process:
1) there must be space enough in order to contain essential features of the deposition facility, like a shutter, the entrance to the vacuum pumping system, the deposited mass analyzer, etc.;
2) the heating of the sample zone should be avoided;
3) the uniformity of the evaporated film becomes as worse as larger is the sample surface involved (say its width is T).

Consequently, it is not at all uncommon the usage of huge ratios between the vacuum chamber internal surface and the sample's one (say: h, L>l).

The physical phenomenon that is the basis of evaporation techniques is an intrinsically not-directional process, since the distribution in the directions of the emitted atoms follows an n-th power cosine law that is the experimental generalization of the model cosine law: $dM_s/dA_s = M_c \cos \phi \cos \theta / \pi r^2$ where $M_s/A_s$ is the deposited film mass per unit surface, $\phi, \theta$ are the angles characterizing the emission direction in space, and r is the distance from the target.

This means that we are dealing with important percentages of the total evaporated flux that are deposited on the internal surfaces of the chamber, far from the sample and not deposited on it.

In a sputtering deposition technique, the atoms are ejected because of ions behaving as 'projectiles' on the target surface. The ejected atoms still have a cosine distribution in the emission regardless (in first approximation) of the incidence angle of the projectiles.

In the arc vapor technique, instead, ions are ejected from the target and they can be selectively driven towards the zone of interest using of voltage-biased surfaces (acting as accelerators) or with the combined action of magnetic fields. Finally, ion-plating differs from the cases previously considered only because of the plasma environment in which it takes place, so no further considerations are needed.

We now discuss the characteristics of the vacuum chambers. These are usually in stainless steel and have simple shapes:
- rectangular shaped;
- bell jars;
- D-shaped;
- cylindrical.

Another variable element is the access to the chamber. D-shaped and bell jars chambers always have apertures on the lateral structure, while rectangular and cylindrical ones could also have this aperture window on the top of the chamber itself.

The sample is usually mounted on top of the chamber. A shutter-system provides, if needed, a barrier to prevent the flux of the depositing material from getting in touch with the sample zone. When not in use, this screen is usually placed in a separated zone near the top.

The instruments used in the kinds of processes so far described are in general very robust and need just a few maintenance procedures. In particular, the cleaning of the chamber is a process seldom done and inaccurate, usually avoided, if not strictly needed, because of contamination of the chamber with dangerous/unwanted substances.

The main disadvantage of all the deposition processes is evidently the fact that, given the particular geometry of the deposition chamber, the small (in comparison) dimensions of the sample, its position far from the source and the difficulty to focus the beam of target's atoms onto the sample alone, the greatest part of the ejected material will diffuse through the chamber and deposit on the internal surfaces, in zones where it is completely unnecessary. In general, metal-metal interfaces have good adhesion properties. Therefore the metals deposited by accident on the steel walls of the chamber, along the various processes and the whole lifetime of the facility, will go wasted, since forming several superposed thin layers (about 0.1 up to 5 μm thick), which are highly adherent to each other.

At the moment, no specific maintenance procedure exists as a routine for chambers of evaporators/sputterers in order to reduce the high wasting percentages, nor any recovering of the materials deposited inside on unwanted surfaces. There's more than one explanation for such a lack:
1) at the current state of the art, it is a difficult manual scraping procedure of the internal chamber walls, which requires considerable time;
2) during this cleaning process, the facility can-not be used;
3) scraping the walls makes unavoidable a 'reconditioning' of the chamber before it can be properly used again;

4) the result of these cleaning procedures would be a dust of different, finely mixed materials, which should consequently be recovered through accurate chemical separation.

The conclusion is that the owners of deposition facilities normally wait the end of the machine's lifetime (even more than 10 years) and finally sell them to companies which are specialized in the field of wasted metal recovery.

In order to resolve the problem described above, the present invention aims to collect, retrieve and select the wasted materials deriving from metal deposition processes (referring in particular to techniques of evaporation and sputtering), by inserting an electro-mechanical system inside the vacuum chamber of the deposition facility.

The system is designed using a modular scheme, in order to be adapted to different types of vacuum chambers of evaporators-sputterers commercially available. The system allows the recovery of high percentage of wasted material (again in particular for evaporation and sputtering) and differentiates into two different types, making it easier to remove the unwanted layers deposited in the vacuum chamber.

With the adoption of the system described above, the recovery of one target material becomes a simple routine operation. This is convenient and especially profitable for the recovery of gold (Au), silver (Ag) and other precious metals already in small scales, and for large scales, aluminum (Al) recovery could be considered, that alone accounts for 90% of the deposition processes and has a good adhesion with the iron (Fe) of the chamber's walls.

These and other benefits will be evident from the detailed description of the invention that will refer to some illustrative tables from 1/3 to 3/3, in which there are examples of preferred embodiments of the invention, by no means understood as exhaustive.

In particular, the modular system, here disclosed, comprises the following elements:

1) A driver module (1), installed on a horizontal support plate (2) that houses a row of rectangular upright palettes (3), and equipped with a power module (4);
2) A slave module (5), also based on a horizontal support plate (2) that houses a row of rectangular upright palettes (3), connected and activated by the driver module (1) through a transmission system (6);
3) A structure of vertical connection (possible but not strictly necessary) among the individual modules, comprising a tubular frame (7), that connects the different horizontal support plates (2) of the individual modules, and a series of joints (8) that allow preferential directional adaptation of the modules and prevent the concealment of any existing sensors in the room;
4) An electronic interface (9)—between the activating power module (4) and the control software/panel of the deposition facility—that automates the rotation of the palettes (3) in function of the material to be evaporated.

In a basic example configuration, the single module—either the "driver" (1) or the "slave" (5):

a) a fixed horizontal support plate (2), equipped with two different types of housings in a row along the plate itself, a first type at the top, in form of a tubular intrusion, possibly including a coil spring, in which gearwheels (10) are pivoted, a second type at the bottom, to accommodate, in the presence of multiple modules superposed in multiple rows, a suspension system (11) able to withstand the elements (12a in particular) of the lower row;
b) a row of rectangular palettes (3) arranged vertically along the support plate (2), whose blades can be inserted and removed by sliding along the short sides in U-shaped rails (12a, 12b), themselves equipped with tubular inserts (13a, 13b) placed on the side which is opposite to the one where the blade (3) slides; the insert of the bottom rail (13b) is connected rigidly to the gearwheels (10) pivoted in the plate (2); the upper insert (13a) is rigidly connected to a disk (14) or spring (depending on the type of suspension system) housed, but free to rotate, within the plate (2), as they are in fact inserted into a niche, correspondingly disc-shaped or tubular, and the insertion is facilitated by an appropriate groove in the plate;
c) upper transmission belt (15a) that could be omitted, and lower transmission belt (15b) that connect among them the gearwheels (10) arranged in rows, of which the upper transmission belt (15a) is parallel to a linkage gear wheel (6), which is superposed to the last gear wheel at each end of the module adjacent to the nearest contiguous module; the linkage gear wheel (6) transmits the motion to the linkage gear wheel (6) of the nearest contiguous module.

Compared to the slave module (5), the driver module (1) is characterized by the insertion of a power module (4) in one of the slots that host the palettes (3) in a slave module (5). This power module (4) includes an electric motor (16), a pulley (17) and a transmission system of the movement (6, 10, 15a, 15b). In particular, the power module (4) allows the rotation of the palettes (3) through a transmission mechanism like transmission belts (15a, 15b) for the other slots of the same engine module (1), and with the gearwheel mechanism (6) for the contiguous slave module (5).

The blades (3) can be installed inside the grooves of the rails (12a, 12b) mounted on the horizontal plates (2) easily by sliding them. The upper carriage (12a) can slide along the blade (3) or it can also be part of it. In the first case, it is necessary to use a suspension system (11) of the upper carriage (12a), in the second case, a simple groove inside the horizontal plate (2) can be made, combined with a spring system (18) on top of the lower tubular extrusion (13b), which provides the required support and allows the removal of the blade (3).

In a preferred embodiment of the invention, the blades (3) are made of composite material, characterized by a core of metal or alumina (apt to conditions of Ultra High Vacuum), and two surface polymeric layers (Polyvinyl Alcohol, Poly-Methyl MethAcrylate) which are easily removable (having a low adhesion to the material to be recovered) but resistant to temperature-pressure conditions of the chamber. The choice of these polymeric materials can be varied case by case, considering adhesion to the target material mainly used.

The modular system invented will be placed between the crucible and the chamber walls of the deposition facility, excluding three areas:
- the area where the sample is placed, usually on top, may be ruled out when the free surface (surface not affected by the deposition) is very small;
- the area where tools (e.g., the mass analyzer) are located for the analysis and editing of the film are located, generally placed at the top of the chamber, except in special cases;
- the openings that allow access to the vacuum chamber, placed on top of the structure or on its side surfaces.

The system is therefore normally not installed on the top of the vacuum chamber, and lateral windows can be left free by using the skeletal support and avoiding the assembly of the palettes (3) in the areas of interest.

Being a modular system, many alternative configurations are possible, as it is in example illustrated on drawings 1/3 to 3/3 attached to the description. Especially, in these drawings:

BRIEF DESCRIPTION OF THE DRAWINGS

FIG. 6 shows how the bottom tubular insert (13b) is equipped with a spring system (18) act to maintain the palette (3) in place.

DETAILED DESCRIPTION OF THE PREFERRED EMBODIMENTS

If the joints are not necessary, e.g. because the shape of the room is straight, the free space left between the different 'levels' of the structure can be reduced to achieve higher coverage rates.

Figure 1:
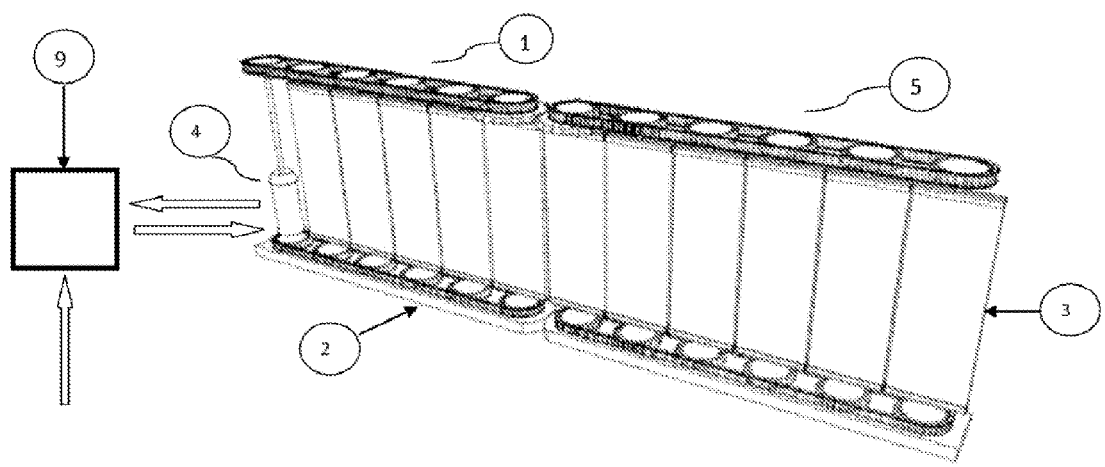
FIGS. 1 and 2 show a basic configuration, namely the combination of a driver module (1) and a slave module (5), with double—higher (15a) and bottom (15b)—chain and a linkage wheel (6) parallel to the top chain (15a).
Figure 2:
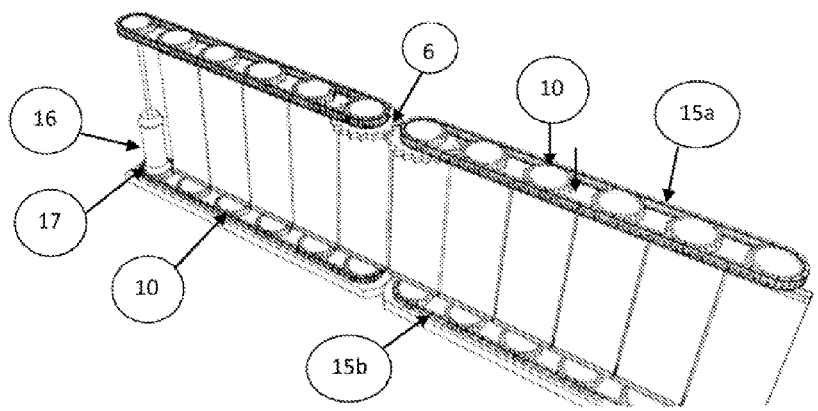
Figure 3:
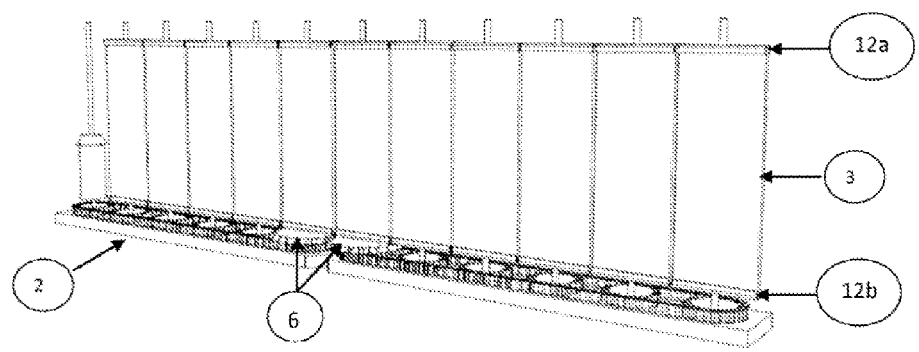
FIG. 3 shows a simplified basic configuration, which has only the lower chain (15b), with the linkage wheel (6). In this way, more space can be used to recover the metal material, and the only disadvantage is a higher probability of mechanical locks for the palettes (3).
Figure 4:
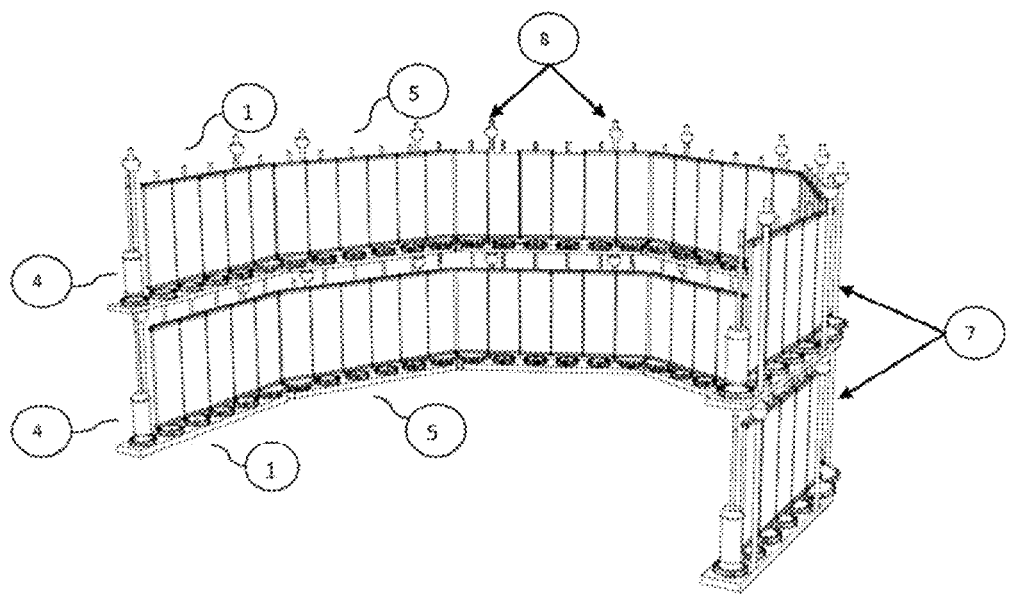
FIGS. 4 and 5 show a possible arrangement disposition of a total of 12 modules (placed in 2 rows of 6 modules each), to be used in D-shaped vacuum chambers.
Figure 5:
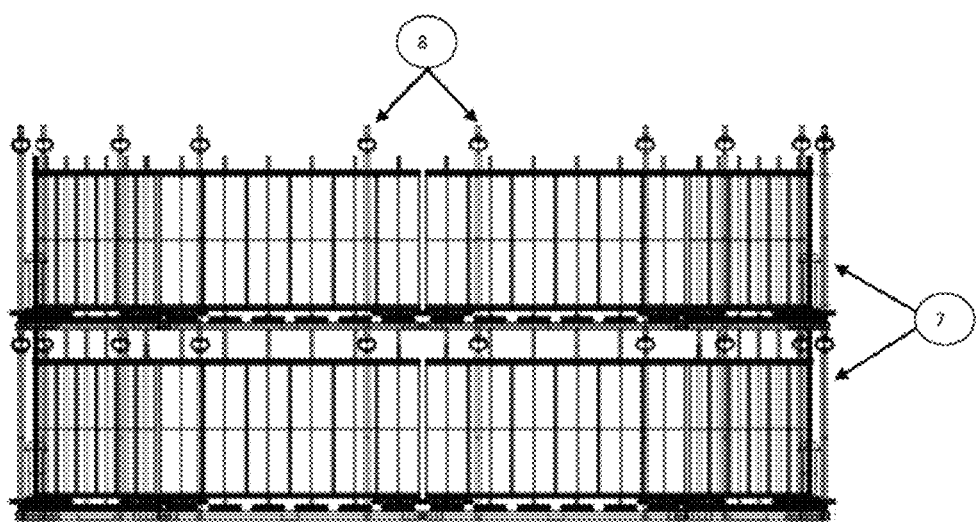
Figure 6:
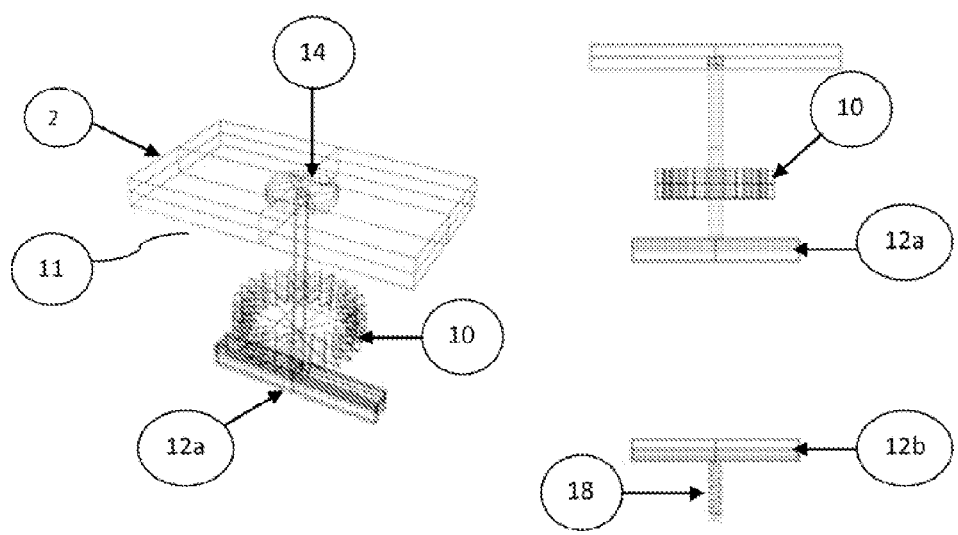
FIG. 6 shows the suspension system (11), able to hold the upper rail (12a) that supports a single palette (3) and allows its rotation, and also a frontal view of the two rails, top (12a) and lower (12b), with their tubular inserts (13a, 13b) connecting them with the corresponding gearwheel (10)
Figure 7:
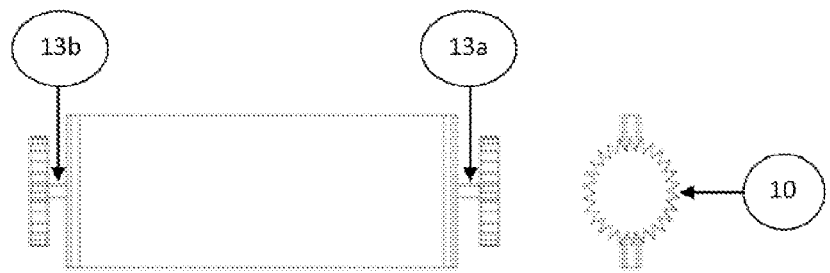
FIG. 7 shows the perspective and the orthogonal projection of a single blade (3) and of the connection: blade (3), the rail supports (12a, 12b), the tubular inserts (13a, 13b) and the gearwheels (10).
Figure 7:
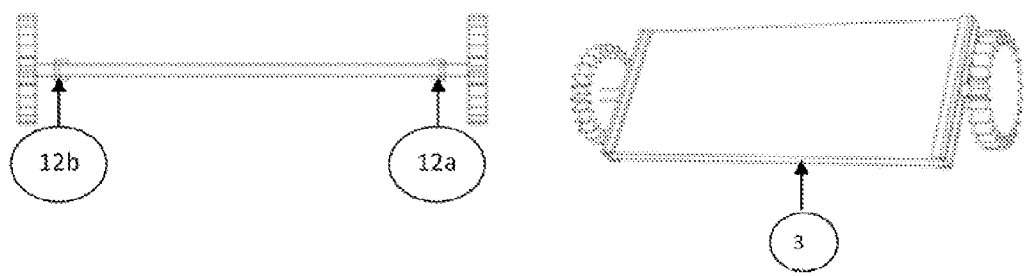

A rough illustrative calculation of the coverage percentage that can be achieved using FIG. 5: in this case, the ratio covered area/total area=66%.

We now discuss the working principle of the system in a preferred embodiment. The palettes (3) are rotated by the electric motor system in two steps of rotation that allow to intercept various materials in the process of deposition, in order that these evaporated/sputtered materials, rather than condense on the entire inner surface of the chamber, including the sample area, are mostly collected by the blades (3).

In particular, the two steps of rotation of the palettes (3) allow the recovery of preferred materials (chosen according to ease/convenience of separation and reuse) that are going to deposit in the form of a uniform layer on one side ("side a") and other materials, forming several films layered on the opposite side ("side b").

In the absence of the screen made up by the blades (3), the material collected should be considered as a waste in the economy of the process.

The electronic interface is able to identify, during the deposition process, when the target material is being used: if so, the face of the blade (3) facing the flow of atoms will be the "a-side". Each time a different material is being deposited, a 180° rotation will expose the "b-side".

In particular, this electronic interface (9), between the power module (4) and the control system of the deposition facility, handles input signals identifying the types of materials used, and the time-on and time-off of the crucibles. These signals are provided automatically by the output of the control system apparatus, if present, otherwise they can be manually entered by the user, as it is the case for other data about the end-position, time of start-up and rotation speed of the palettes (3).

This interface also generates outputs, like the calibration and power signals for starting or stopping the power module (4), and receives feedback controls, as the end-position of the palettes or operating parameters of the power module (4).

In order not to disrupt the vacuum, all mechanical parts cannot be lubricated, but since there's no need of fast movements, it is sufficient that the command to activate the rotation is given sufficiently in advance, with respect to the possible change in the target material used.

A transmission chain (15a, 15b), although more complex than a gear system, has been preferred to reduce the ratio r/I and thus avoid the shadowing effects of the atoms' flux, that may become important at the top of the structure.

At the end of the lifetime of the blades (3), as decided case by case, after verifying that the deposited metal layers may not to be too fragile or thin, the blades can be replaced and will undergo a simple chemical etching process for the removal of polymeric layers. This leads to the immediate recovery of the priority material in slab form and more sophisticated separation procedures can follow for the recovery of other materials, if convenient.

Another advantage of the system described so far is that it can be independently produced and then mounted inside pre-existing deposition chambers, using the different modules in the most suitable configuration type, according to the shape of the chamber and the coverage percentage desired, or, alternatively, the system can be embedded already in the production process of the vacuum chamber.

The invention claimed is:

1. An electro-mechanical system to be used inside a vacuum chamber's walls of a metal coating facility, to perform a collection process and retrieval of wasted metal materials derived from metal coating processes inside vacuum chambers;

said electro-mechanical system comprising a driver module (1) which in turn comprises:
- a horizontal support plate (2) that houses a row of a plurality of rectangular upright palettes (3) arranged vertically along said support plate (2), said palettes having a flat front side a second, opposite flat side and two short edge sides;
- a power module (4) comprising an electric motor (16) and a transmission system of the movement (6, 10, 15a, 15b) that operates the rotation of the palettes (3) around their vertical axes;
- an electronic interface (9) that automates the rotation of the palettes (3) by handling signals from sensors to identify the types of materials deposited, and the time-on and time-off of a crucible which contains a material to be deposited on target objects placed inside said vacuum chamber;

and wherein said palettes (3) are rotated by the power module (4) in two steps of rotation that allow the interception of coating materials in the form of a uniform layer on one side and other materials on the opposite side of each palette (3);

said electro-mechanical system is configured to facilitate an interception, condensation, deposition on palettes surfaces and later collection processes, of metal material, normally wasted, used during metal coating processes inside vacuum chambers; said excess material is intercepted and deposited on the palettes (3) collection surfaces which are specifically coated based on the target material and facilitate the interception and adhesion of said excess materials;

and wherein said palettes (3) are made of composite material, characterized by a core of metal or alumina to withstand conditions of ultra high vacuum negative pressure, and coated by two polymeric layers of Polyvinyl Alcohol and PolyMethyl MethAcrylate and having a low adhesion feature to the material deposited on said palettes, to facilitate its collection, wherein said polymeric layers are resistant to high temperature and negative pressure conditions inside said vacuum chamber.

2. An electro-mechanical system according to claim 1, further comprising at least a slave module (5) which in turn comprises a horizontal support plate (2) that houses a row of rectangular upright palettes (3) arranged vertically using one of their two short edge sides, said palettes (3) having a flat front side a second, opposite flat side and being connected and rotated by the driver module (1) through a mechanical transmission system.

3. An electro-mechanical system according to claim 1 wherein said rectangular palettes (3) are equipped with tubular inserts (13a, 13b) and wherein each bottom insert (13b) of each palette (3) is rigidly connected to a gearwheel (10) rotating inside the horizontal support plate (2).

4. An electro-mechanical system according to claim 2, wherein said slave module (5) further comprises a lower transmission belt (15b) that connects multiple gearwheels (10) arranged in a row to allow said palettes (3) to rotate in a synchronized mode.

5. An electro-mechanical system according to claim 1, further comprising a structure of vertical connection among individual slave modules (5), comprising a tubular frame (7) that connects the horizontal support plates (2) of each individual slave modules (5), and a series of joints (8) that allow desired directional orientation of the slave modules (5) and to prevent the obstruction of any existing sensor present inside the vacuum chamber.

6. An electro-mechanical system according to claim 1 wherein said palettes (3) can be inserted and removed by sliding them by one of their short edge along U-shaped rails (12a, 12b).

7. An electro-mechanical system according to claim 1 wherein said system is configured to be installed inside a vacuum chamber and placed between said crucible and said chamber's walls of said metal coating facility.

8. An electro-mechanical system according to claim 1, wherein said electronic interface (9), positioned between the driver module (1) and a software control panel of the vacuum chamber is able to process input signals identifying typologies of metal coating materials used, and said software control panel operates the switch-on and switch-off of the crucible, said signals are automatically generated by a software control panel of an evaporation/sputtering facility, if present; if not present, these signals are manually supplied by an operator, along with an end-up position, start-up time and rotation speed of the palettes (3).

9. An electro-mechanical system according to claim 8, wherein said electronic interface (9) is also able to generate output signals like calibration checkup requests and power signals to start and stop the electric motor (16), and receiving as a control feedback from the power module (4) operating parameters and its stop position data.

10. A vacuum chamber of a metal coating facility embedding said electro-mechanical system as described in claim 1 for the collection process, retrieval and recovery of wasted materials during metal coating processes.

* * * * *